United States Patent [19]

Stein

[11] 3,909,307

[45] Aug. 13, 1975

[54] PROCESS FOR COMPENSATING BOUNDARY CHARGES IN SILICON THIN LAYERS EPITAXIALLY GROWN ON A SUBSTRATE

[75] Inventor: Karl-Ulrich Stein, Munich, Germany

[73] Assignee: Siemens Aktiengesellschaft, Berlin & Munich, Germany

[22] Filed: Aug. 19, 1974

[21] Appl. No.: 498,476

[30] Foreign Application Priority Data

Sept. 3, 1973 Germany .......................... 2344320

[52] U.S. Cl. ................ 148/1.5; 148/175; 148/186; 148/187; 148/188; 427/85

[51] Int. Cl.[2] ........................ H01L 7/54; H01L 7/36

[58] Field of Search ........... 148/1.5, 175, 188, 186; 117/201

[56] References Cited

UNITED STATES PATENTS

| | | | |
|---|---|---|---|
| 3,520,741 | 7/1970 | Mankarios | 148/175 X |
| 3,582,410 | 6/1971 | Chapelle | 148/186 |
| 3,658,586 | 4/1972 | Wang | 148/175 |
| 3,767,483 | 10/1973 | Tokuyama et al. | 148/186 |

*Primary Examiner*—G. Ozaki
*Attorney, Agent, or Firm*—Hill, Gross, Simpson, Van Santen, Steadman, Chiara & Simpson

[57] ABSTRACT

Process for compensating for the presence of boundary charges in semiconductor layers which are grown on a monocrystalline insulating substrate including the step of introducing doping atoms into the region of the boundary charges. The doping atoms can be introduced before any semiconductor has been deposited after a thin layer of the semiconductor has been epitaxially grown on the substrate, or after all of the epitaxial layer has been grown.

13 Claims, 2 Drawing Figures

PROCESS FOR COMPENSATING BOUNDARY CHARGES IN SILICON THIN LAYERS EPITAXIALLY GROWN ON A SUBSTRATE

BACKGROUND OF THE INVENTION

1. Field of the Invention

This invention is in the field of growing epitaxial layers on an insulating substrate and provides a means for reducing or eliminating boundary charges which normally occur in such growth.

2. Description of the Prior Art

In an earlier German patent application No. P22 08 083.7 filed by the assignee of the present invention, there is described a process for the production of p-channel field effect transistors. In these field effect transistors which include a silicon layer applied to a spinel substrate, negative charges occur in the spinel substrate at the boundary between the substrate and the silicon layer. This leads to the formation, within the silicon body, of a positively charged zone which represents an electric connection between the p+ doped source zone and the p+ doped drain zone of the silicon body. The above-identified patent application proposes that boundary charges which are formed on the application of silicon layers to the spinel can be kept low or reduced by a heat treatment in hydrogen.

SUMMARY OF THE INVENTION

The present invention provides a process in which boundary charges at the boundary between a semiconductor layer and an underlying substrate can be controlled in a predetermined manner. This is accomplished by introducing doping atoms into the region of the boundary charges. The doping atoms can be implanted into the surface of the substrate prior to the deposition of the epitaxial layer, after the deposition of a first thin epitaxial layer on the substrate or following deposition of the entire epitaxial layer on the substrate. The doping atoms are preferably boron or phosphorus and are introduced by ion implantation or by solid body diffusion from a doped silicon or silicon dioxide layer.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

The present invention proceeds on the basis that compensating boundary charges makes it possible to improve the function of components in which the boundary charges occur. Thus, for example, in an MOS field effect transistor, an undesired residual current between the diffused zones, i.e., the source zone and the drain zone, can be avoided by the practice of the present invention.

Figure 1:
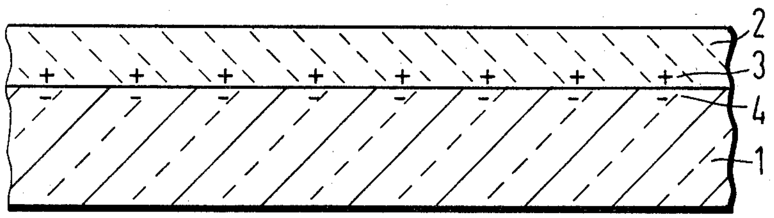
FIGS. 1 and 2 are schematic representations of the boundary charges which exist in epitaxially grown silicon layers on a substrate.

In FIG. 1, there is illustrated a semiconductor layer 2 which is epitaxially grown on a substrate 1. The substrate 1 may consist of sapphire or spinel and the layer 2 of silicon. The boundary charges which occur at the boundary between the layers 1 and 2 are identified at reference numerals 3 and 4. In the case of a silicon thin layer on spinel, the negative boundary charges 4 are contained in the zones of the substrate 1 which are close to the surface, and the positive boundary charges 3 influenced by the negative charges are contained in the zones of the layer 3 which are close to the surface and face the layer 1.

In accordance with the present invention, the boundary charges 3 and 4 occurring at the boundary between the substrate 1 and the silicon thin layer 2 which is epitaxially applied thereto are compensated for by introducing doping atoms in the boundary area, and possibly also in the substrate crystal. These doping atoms are preferably introduced into the corresponding zones by means of ion implantation. By introducing a predetermined quantity of doping atoms, it is possible to control the density of the boundary charges. In particular, it is possible to use the process of the present invention to compensate for existing boundary charges.

In accordance with one modification in the present invention, the doping atoms are introduced in a precisely determined amount into the surface of the substrate crystal prior to the deposition of the epitaxial silicon layer 2 on the surface of the substrate 1. The introduced doping atoms bring about a space charge which is opposite to the boundary charge which arises in the substrate.

Figure 2:
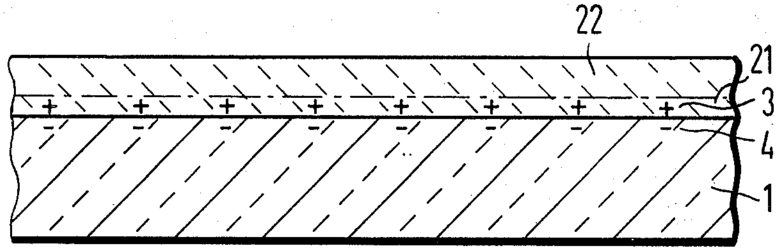

As illustrated in FIG. 2, in accordance with a further modification of the invention, following the deposition of a first thin epitaxial layer 21 on the substrate 1, the doping atoms are implanted into the thin layer 21 and into the region of the boundary between the thin layer 21 and the substrate 1. The thickness of the thin epitaxial layer preferably amounts to about 0.2 micron. After the doping atoms are implanted into the thin layer 21, the remainder of the epitaxial layer 22 is grown and strengthened until the thickness of the layers 21 and 22 reaches the desired value.

One advantage of this form of the process of the invention is that it makes it possible to implant the doping atoms with a narrow profile in the region of the boundary area with a small quantity of energy.

In accordance with a further modification of the process of the invention, following the production of the epitaxial silicon layer 2 on the substrate 1, the doping atoms are implanted with a relatively large quantity of energy into the region of the boundary between the epitaxial layer and the substrate. In this case, the doping atoms can be introduced even when the diffusion processes required for the production of semiconductor components have already been concluded. An advantage of this form of the invention is that the entire epitaxial layer 2 is produced prior to the introduction of the doping atoms.

If the doping atoms are introduced with the aid of ion implantation, it is particularly convenient to fix the quantity of doping atoms which are to be introduced. In addition, high temperature processes such as are required in diffusion processes are avoided. It is thus possible to avoid damage to the silicon layer 2 which is formed on the substrate 1.

Preferably phosphorous ions or boron ions are implanted as dopants. Substances having a low diffusion concentration are also suitable as dopants. Such substances are, for example, arsenic and indium.

In the case of a silicon thin layer on spinel, it is preferable to use phosphorous ions in order to compensate boundary charges.

In the case of a silicon thin layer on sapphire, positive boundary charges arise at the surface of the sapphire substrate. These positive boundary charges are influenced by negative boundary charges in the region of the silicon thin layer which are close to the surface and are facing the sapphire substrate. In this type of arrangement, it is preferable to implant boron ions in order to compensate for boundary charges.

Following the implantation, the implanted zones are activated. For this purpose, the semiconductor assembly is heated. The effect of this heat treatment is that the implanted ions which initially occupy electrically inactive interstitial lattice positions move into electrically active lattice positions. Preferably, the semiconductor assembly is heated for approximately 10 to 20 minutes at about 500°C as a result of which the implanted ions are activated.

In a further modification of the invention, the boundary surface zones are doped with the aid of solid body diffusion, for example, by a solid body diffusion from doped silicon layers, or alternatively from a doped silicon dioxide layer. In this way it is also possible to regulate the small amount of doping required in a controlled manner.

It should be evident that various modifications can be made to the described embodiments without departing from the scope of the present invention.

I claim as my invention:

1. A process for compensating boundary charges in a semiconducting layer which is epitaxially grown on an insulating substrate which includes the step of introducing doping atoms into the region of the boundary charges.

2. A process according to claim 1 in which said semiconducting layer is silicon and said substrate is monocrystalline.

3. A process according to claim 1 in which the doping atoms are introduced into the surface of the substrate prior to the deposition of the epitaxial layer.

4. A process according to claim 1 in which a first thin semiconducting layer is first epitaxially deposited on said substrate, the doping atoms are introduced through this thin layer and then the remainder of the semiconducting layer is grown over said thin layer.

5. A process according to claim 4 in which said thin layer has a thickness of about 0.2 micron.

6. A process according to claim 1 in which said doping atoms are introduced into the region of the boundary charges after the semiconducting layer has been fully deposited on said substrate.

7. A process according to claim 1 in which said doping atoms are boron or phosphorus.

8. A process according to claim 1 in which said doping atoms are arsenic or indium.

9. A process accrding to claim 1 in which said doping atoms are introduced by ion implantation.

10. A process according to claim 9 in which the implanted ions are activated by heat treatment.

11. A process according to claim 1 in which the dopants are introduced by means of solid body diffusion.

12. A process according to claim 11 in which a doped solid body is used as a source for the solid body diffusion.

13. A process according to claim 12 in which doped silicon dioxide is used as a doped solid body.

* * * * *